US011383736B2

(12) United States Patent
Ozeki et al.

(10) Patent No.: US 11,383,736 B2
(45) Date of Patent: Jul. 12, 2022

(54) VEHICLE BATTERY CONTROLLER

(71) Applicant: TOYOTA JIDOSHA KABUSHIKI KAISHA, Toyota (JP)

(72) Inventors: Akihiro Ozeki, Chiryu (JP); Norio Nishiwaki, Tajimi (JP); Yoshiyuki Takahara, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 284 days.

(21) Appl. No.: 16/801,664

(22) Filed: Feb. 26, 2020

(65) Prior Publication Data
US 2020/0298888 A1  Sep. 24, 2020

(30) Foreign Application Priority Data

Mar. 20, 2019  (JP) .............................. JP2019-053395

(51) Int. Cl.
*B60W 60/00* (2020.01)
*B60R 16/033* (2006.01)
(Continued)

(52) U.S. Cl.
CPC ..... *B60W 60/00186* (2020.02); *B60R 16/033* (2013.01); *B60R 16/04* (2013.01);
(Continued)

(58) Field of Classification Search
CPC .......... B60L 50/00; B60L 50/15; B60L 50/50; B60L 50/60; B60L 50/66; B60L 58/00; B60L 58/10; B60L 58/12; B60L 58/18; B60L 2210/10; B60L 3/00; H01M 10/425; H01M 10/443; H01M 10/46; H01M 10/486; H01M 2010/4271; H01M 2220/20;
(Continued)

(56) References Cited

U.S. PATENT DOCUMENTS 8,471,521 B2 * 6/2013 Stewart ............... H01M 16/006
320/132
8,803,471 B2 * 8/2014 Stewart ................... B60L 58/21
701/22
2019/0212391 A1  7/2019 Koller et al.

FOREIGN PATENT DOCUMENTS

DE  102016211898 A1  1/2018
JP  2018-069900 A  5/2018

* cited by examiner

*Primary Examiner* — Anthony R Jimenez
(74) *Attorney, Agent, or Firm* — Oliff PLC

(57) ABSTRACT

A vehicle battery controller includes a sensor configured to acquire information on a subordinate battery configured to back up a main battery during autonomous driving, a DDC provided between the main battery and the subordinate battery, a switching circuit configured to switch a connection state of the subordinate battery between a connection state for manual driving and a connection state for the autonomous driving, and an electronic control unit configured to control charging and discharging of the subordinate battery by controlling the DDC and the switching circuit based on the information acquired by the sensor. The electronic control unit permits the autonomous driving when determination is made, through first battery control, that the subordinate battery can output backup power. The electronic control unit determines whether the subordinate battery can output the backup power by executing second battery control having higher accuracy than that of the first battery control.

8 Claims, 13 Drawing Sheets

(51) Int. Cl.
*B60R 16/04* (2006.01)
*B60W 50/02* (2012.01)
*G05D 1/00* (2006.01)
*H01M 10/42* (2006.01)
*H01M 10/44* (2006.01)
*H01M 10/46* (2006.01)
*H01M 10/48* (2006.01)
*H02J 7/00* (2006.01)

(52) U.S. Cl.
CPC ........... *B60W 50/02* (2013.01); *G05D 1/0088* (2013.01); *H01M 10/425* (2013.01); *H01M 10/443* (2013.01); *H01M 10/46* (2013.01); *H01M 10/486* (2013.01); *H02J 7/007* (2013.01); *H02J 7/0047* (2013.01); *B60W 60/005* (2020.02); *B60W 2510/244* (2013.01); *B60W 2510/246* (2013.01); *B60W 2710/244* (2013.01); *G05D 1/0061* (2013.01); *H01M 2010/4271* (2013.01); *H01M 2220/20* (2013.01)

(58) Field of Classification Search
CPC ... G05D 1/0061; G05D 1/0088; H02J 7/0047; H02J 7/007; B60R 16/033; B60R 16/04; B60W 50/00; B60W 50/02; B60W 60/00; B60W 60/005; B60W 60/00186; B60W 2510/244; B60W 2510/246; B60W 2050/007; B60W 2050/0075; B60W 2050/0095; B60W 2050/0097; B60W 2710/244

See application file for complete search history.

FIG. 7

<STANDARD BATTERY RESISTANCE MAP>

| TEMPERATURE [°C] | SOC [%] | | | | | |
|---|---|---|---|---|---|---|
| | 20 | 30 | 40 | 50 | 60 | 70 |
| -15 | r11 | r12 | r13 | r14 | r15 | r16 |
| -10 | r21 | r22 | r23 | r24 | r25 | r26 |
| -5 | r31 | r32 | r33 | r34 | r35 | r36 |
| 0 | r41 | r42 | r43 | r44 | r45 | r46 |
| 5 | r51 | r52 | r53 | r54 | r55 | r56 |
| 10 | r61 | r62 | r63 | r64 | r65 | r66 |
| 15 | r71 | r72 | r73 | r74 | r75 | r76 |

[UNIT: Ω]

FIG. 8A1

<STANDARD BATTERY RESISTANCE MAP>

| TEMPE-RATURE | SOC | | | | | |
|---|---|---|---|---|---|---|
| | 20 | 30 | 40 | 50 | 60 | 70 |
| -15 | r11 | r12 | r13 | r14 | r15 | r16 |
| -10 | r21 | r22 | r23 | r24 | r25 | r26 |
| -5 | r31 | r32 | r33 | r34 | r35 | r36 |
| 0 | r41 | r42 | r43 | r44 | r45 | r46 |
| 5 | r51 | r52 | r53 | r54 | r55 | r56 |
| 10 | r61 | r62 | r63 | r64 | r65 | r66 |
| 15 | r71 | r72 | r73 | r74 | r75 | r76 |

RATIO

FIG. 8A2

<MEASURED VALUE AND PREDICTED VALUE OF BATTERY>

| TEMPE-RATURE | SOC | | | | | |
|---|---|---|---|---|---|---|
| | 20 | 30 | 40 | 50 | 60 | 70 |
| -15 | | | | | | |
| -10 | | | | | | |
| -5 | | | | | | |
| 0 | | | R43 | | | |
| 5 | | | | | | |
| 10 | | | | | | R |
| 15 | | | | | | |

RATIO

<MEASURED VALUE AND
PREDICTED VALUES OF BATTERY>

| | | \multicolumn{6}{c|}{S O C} |
|---|---|---|---|---|---|---|---|
| | | 20 | 30 | 40 | 50 | 60 | 70 |
| TEMPERATURE | -15 | | | R13 | | R15 | |
| | -10 | | | R23 | | R25 | |
| | -5 | | | R33 | | R35 | |
| | 0 | | | R43 | | R45 | |
| | 5 | | | R53 | | R55 | |
| | 10 | | | R63 | | R | |
| | 15 | | | R73 | | R75 | |

FIG. 10A
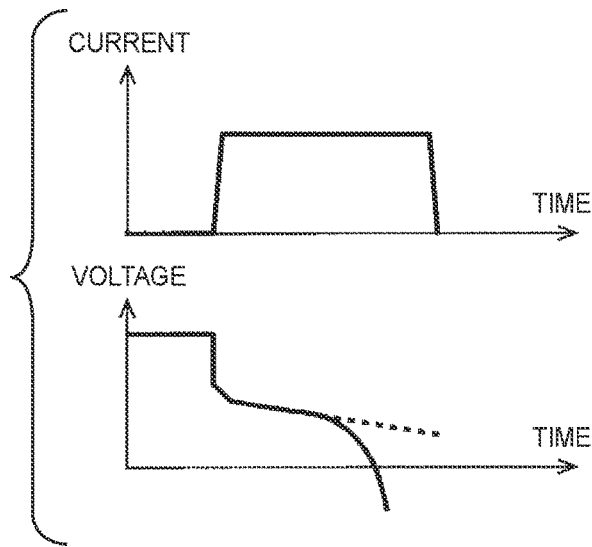
FIG. 10B
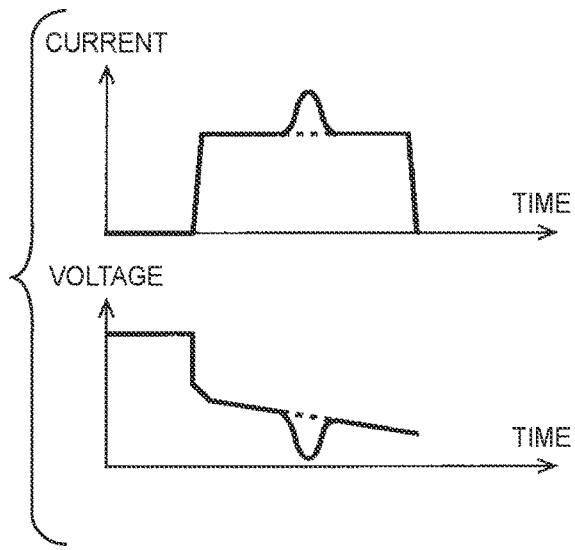
FIG. 11A
<T4 DETERMINATION MAP>
| | | SOC [%] | | |
|---|---|---|---|---|
| | | 40 | 45 | 50 |
| TEMPERATURE [°C] | -15 | P11 | P12 | P13 |
| | -10 | P21 | P22 | P23 |
| | -5 | P31 | P32 | P33 |
| | 0 | P41 | P42 | P43 |
| | 5 | P51 | P52 | P53 |
LOW POWER ↓ HIGH POWER
LOW POWER → HIGH POWER
[UNIT: W]

VEHICLE BATTERY CONTROLLER

INCORPORATION BY REFERENCE

The disclosure of Japanese Patent Application No. 2019-053395 filed on Mar. 20, 2019 including the specification, drawings and abstract is incorporated herein by reference in its entirety.

BACKGROUND

1. Technical Field

The present disclosure relates to a vehicle battery controller.

2. Description of Related Art

Japanese Unexamined Patent Application Publication No. 2018-069900 discloses a battery controller mounted on a vehicle configured to execute autonomous driving. The battery controller includes a lead-acid battery and a lithium ion battery. The lead-acid battery supplies electric power to electric equipment such as accessories. The lithium ion battery is used for backing up the autonomous driving. In this battery controller, when the autonomous driving is requested while charging the lead-acid battery in a state in which the lithium ion battery is disconnected from a power supply line, the lithium ion battery is connected to the power supply line with its voltage reduced to an open-circuit voltage of the lithium ion battery. Therefore, only the lead-acid battery can be charged in a state in which both the lithium ion battery and the lead-acid battery are connected to the power supply line. Thus, the battery controller described in Japanese Unexamined Patent Application Publication No. 2018-069900 secures backup power necessary during a limp home mode of the autonomous driving using the lithium ion battery, and prevents a delay in the charging of the lead-acid battery.

SUMMARY

In the battery controller described in Japanese Unexamined Patent Application Publication No. 2018-069900, when the autonomous driving is requested, the autonomous driving is executed without checking the power storage amount of the battery. To secure the safety of the vehicle, it is desirable to determine, when the autonomous driving is requested, whether the lithium ion battery can output the backup power necessary during the limp home mode before the autonomous driving is executed. This determination generally requires a long time because of a necessity to temporarily discharge the battery such that the current to be consumed in the limp home mode is actually caused to flow, and then charge the battery to a predetermined power storage amount. Therefore, the autonomous driving cannot immediately be executed even if the autonomous driving is requested by a driver or the like.

The present disclosure provides a vehicle battery controller in which autonomous driving requested by a driver or the like can be executed quickly.

One aspect of the present disclosure relates to a vehicle battery controller including a sensor, a DC-DC converter, a switching unit, and a control unit. The sensor is configured to acquire information related to a current, a voltage, and a temperature of a subordinate battery configured to back up a main battery during autonomous driving. The DC-DC converter is provided between the main battery and the subordinate battery. The switching unit is configured to switch a connection state of the subordinate battery between a connection state for manual driving and a connection state for the autonomous driving. The control unit is configured to control charging and discharging of the subordinate battery by controlling the DC-DC converter and the switching unit based on the information acquired by the sensor. The control unit is configured to tentatively determine, by executing a first battery control during a period of the manual driving after an ignition is turned ON, whether the subordinate battery is able to output backup power necessary during a limp home mode of the autonomous driving. The control unit is configured to permit the autonomous driving when determination is made, through the first battery control, that the subordinate battery is able to output the backup power. The control unit is configured to execute the autonomous driving in response to a request after the autonomous driving is permitted. The control unit is configured to determine, by executing a second battery control after the autonomous driving is permitted, whether the subordinate battery is able to output the backup power. The second battery control has higher accuracy than accuracy of the first battery control.

According to the vehicle battery controller described above, when determination is tentatively made that the subordinate battery can output the backup power necessary during the limp home mode before the driver or the like requests the autonomous driving, the requested autonomous driving can quickly be executed after the autonomous driving is permitted.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 7 is a diagram illustrating an example of a standard battery resistance map to be used for the first battery control;

FIG. 8A1 and FIG. 8A2 are explanatory drawings illustrating an example of use of the standard battery resistance map;

FIG. 10A and FIG. 10B are explanatory drawings illustrating an example of determination on an abnormality of a subordinate battery;

FIG. 11A is a diagram illustrating an example of a T4 determination map;

DETAILED DESCRIPTION OF EMBODIMENTS

The present disclosure relates to a vehicle battery controller configured to control a subordinate battery configured to back up a main battery during autonomous driving. The vehicle battery controller estimates the condition of the subordinate battery in a short time during a period of manual driving after an ignition is turned ON. When determination is tentatively made based on an estimation result that the subordinate battery can output backup power necessary during a limp home mode of the autonomous driving, the vehicle battery controller is brought into a state in which the autonomous driving is permissible immediately. Thus, when determination is tentatively made that the subordinate battery can output the backup power before a driver or the like requests the autonomous driving, the requested autonomous driving can quickly be executed after the autonomous driving is permitted.

Embodiment

An embodiment of the present disclosure is described below in detail with reference to the drawings.

<Configuration>

Figure 1:
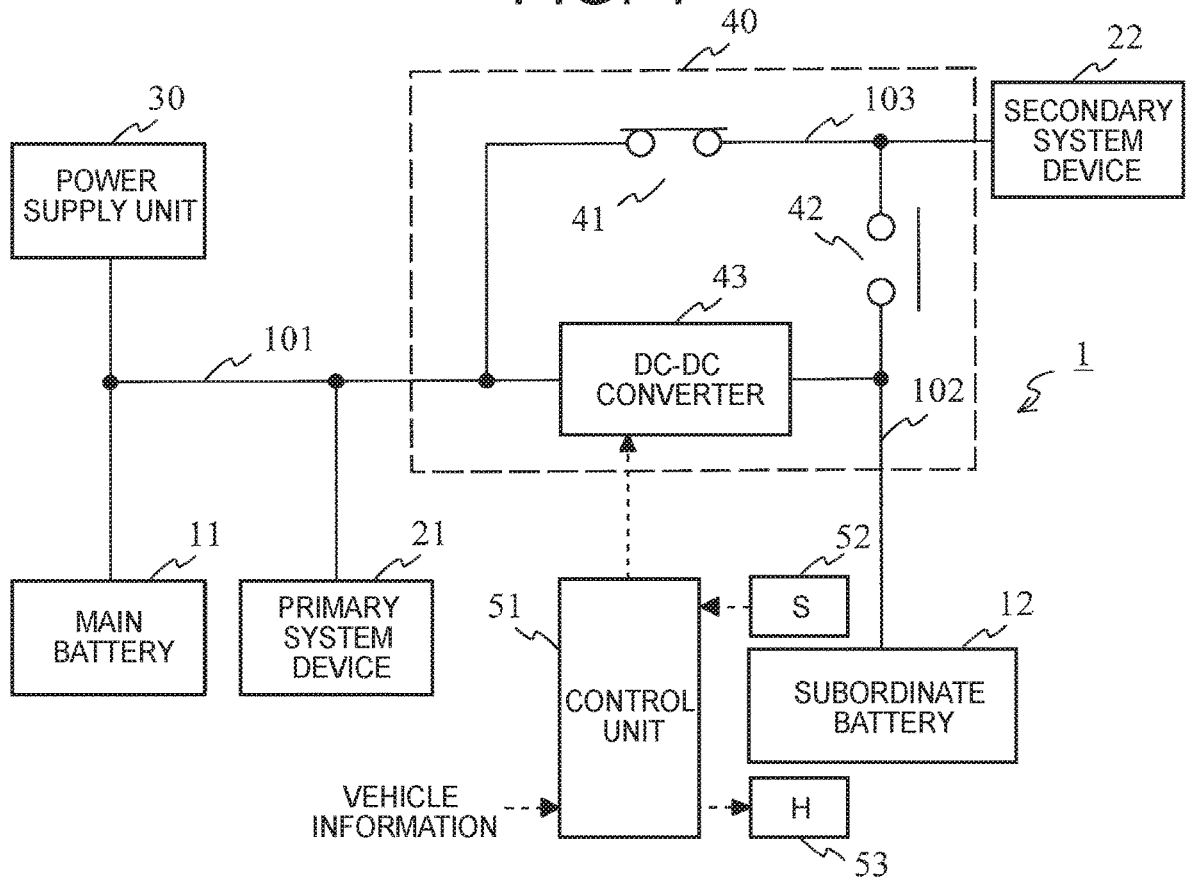
FIG. 1 is a diagram illustrating the overall configuration of a vehicle battery controller according to one embodiment of the present disclosure.

FIG. 1 is a diagram illustrating the overall configuration of a power supply system including a vehicle battery controller 1 according to one embodiment of the present disclosure. The power supply system illustrated in FIG. 1 includes a main battery 11, a subordinate battery 12, a primary system device 21, a secondary system device 22, a power supply unit 30, and a vehicle battery controller 1 including a connection switching circuit 40, a control unit 51, a sensor (S) 52, and a heater (H) 53. The power supply system is mounted on a vehicle configured to switch manual driving and autonomous driving.

The main battery 11, the primary system device 21, the connection switching circuit 40, and the power supply unit 30 are electrically connected by first wiring 101. The subordinate battery 12 and the connection switching circuit 40 are electrically connected by second wiring 102. The secondary system device 22 and the connection switching circuit 40 are electrically connected by third wiring 103.

The power supply unit 30 is a device such as an alternator or a DC-DC converter configured to output predetermined electric power. The electric power output from the power supply unit 30 is supplied to the main battery 11, the primary system device 21, and the connection switching circuit 40.

The main battery 11 is a chargeable/dischargeable secondary battery such as a lead-acid storage battery or a lithium ion battery. The main battery 11 stores electric power output from the power supply unit 30, and discharges electric power stored in the main battery 11 to the primary system device 21 and the connection switching circuit 40.

The subordinate battery 12 is a chargeable/dischargeable secondary battery such as a lead-acid storage battery or a lithium ion battery. The subordinate battery 12 stores electric power output from the power supply unit 30 and electric power of the main battery 11 via the connection switching circuit 40, and discharges (supplies) electric power stored in the subordinate battery 12 to the secondary system device 22 or the like via the connection switching circuit 40. The subordinate battery 12 is redundantly provided for backup so that, even if the main battery 11 fails during the autonomous driving, power supply to the secondary system device 22 provided for the autonomous driving is maintained in place of the main battery 11.

The primary system device 21 is an on-board device to be operated by electric power output from the power supply unit 30 and/or electric power stored in the main battery 11.

The secondary system device 22 is an on-board device to be operated by electric power output from the power supply unit 30 and/or electric power stored in the main battery 11. The secondary system device 22 includes a device necessary for a so-called limp home mode in which, in distress during the autonomous driving, the vehicle is caused to travel until the vehicle is stopped at a safe place. As described later, the secondary system device 22 is operated by electric power output from the power supply unit 30 and/or electric power stored in the main battery 11 during the manual driving, and is operated also by electric power stored in the subordinate battery 12 during the autonomous driving.

The connection switching circuit 40 includes a first switch 41, a second switch 42, and a DC-DC converter 43. The first switch 41 is arranged between the first wiring 101 and the third wiring 103 in an openable and closable manner. The second switch 42 is arranged between the second wiring 102 and the third wiring 103 in an openable and closable manner. Examples of the first switch 41 and the second switch 42 include a semiconductor relay and a mechanical relay. The DC-DC converter 43 is a voltage converter arranged between the first wiring 101 and the second wiring 102 and configured to output electric power input via the first wiring 101 while converting its voltage into a predetermined voltage.

The control unit 51 is an autonomous driving electronic control unit (ECU) including, for example, a microcomputer. The control unit 51 controls open/closed states of the first switch 41 and the second switch 42 of the connection switching circuit 40 based on vehicle information (ignition ON/OFF state and manual driving/autonomous driving state) acquired from an on-board device (not illustrated).

Figure 2A:
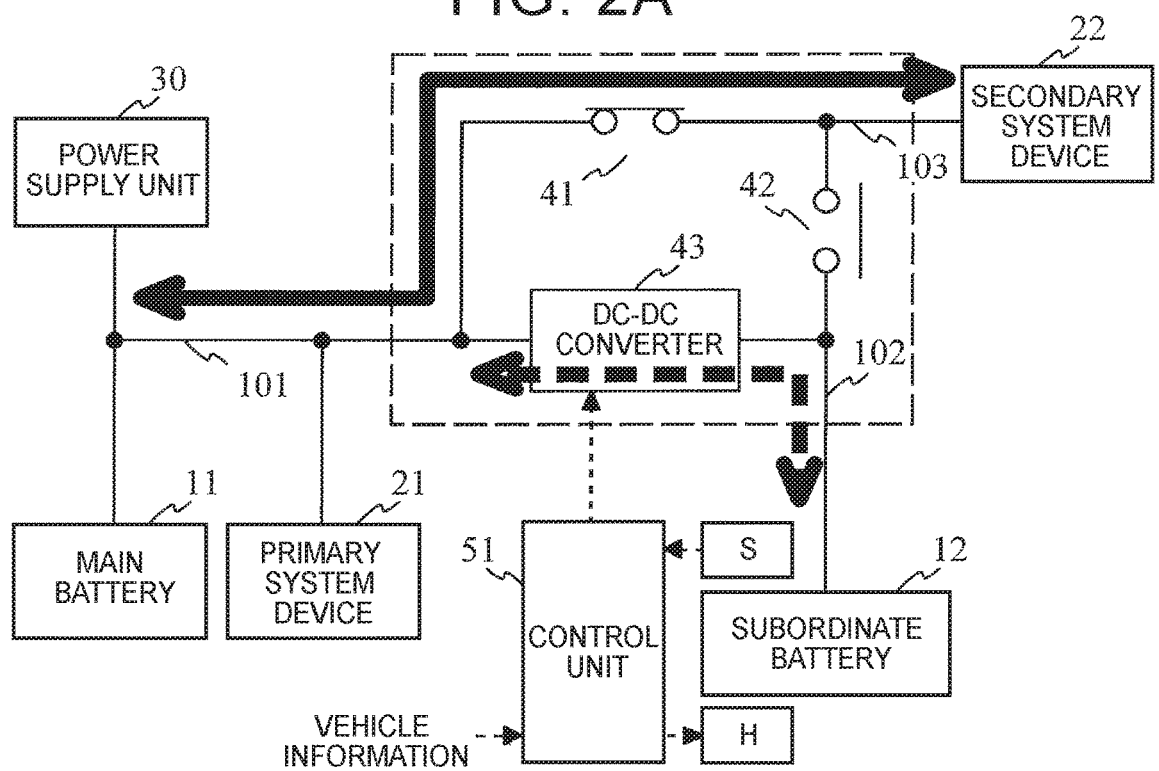
FIG. 2A is an explanatory drawing illustrating a state of the vehicle battery controller during manual driving.
Figure 2B:
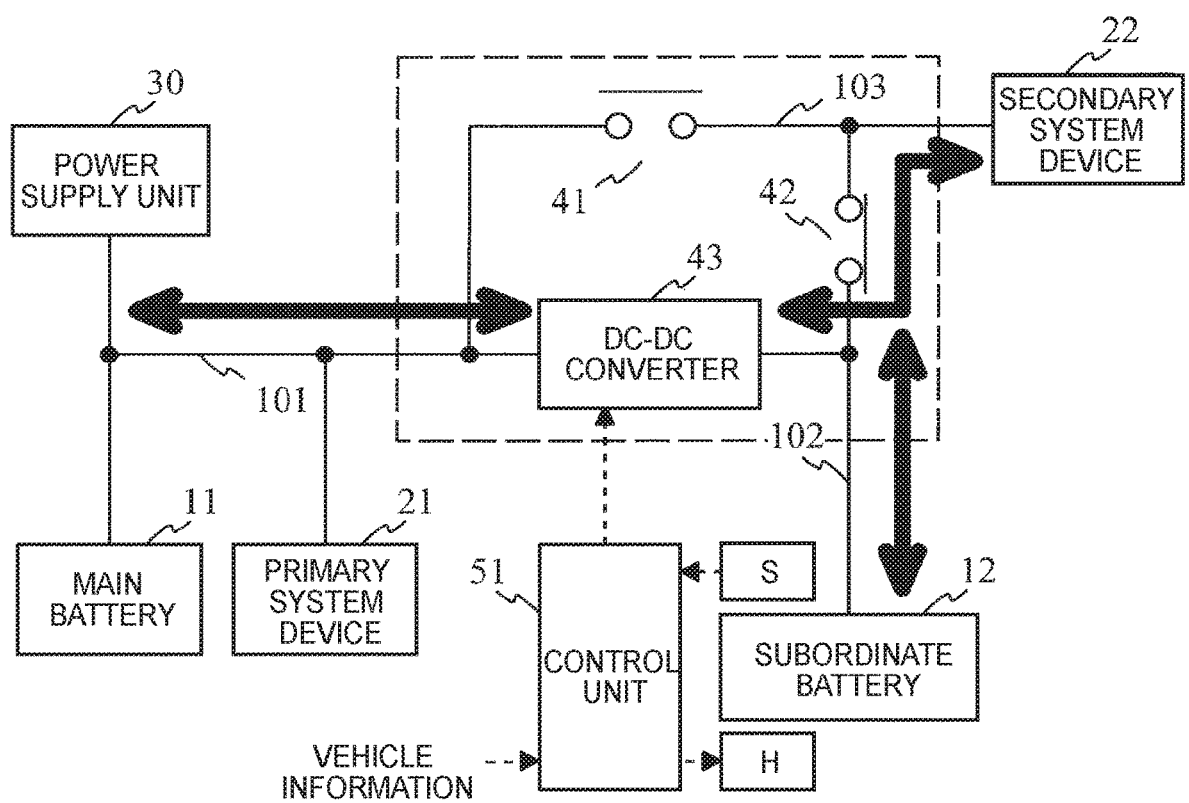
FIG. 2B is an explanatory drawing illustrating a state of the vehicle battery controller during autonomous driving.

Specifically, when the vehicle is in a manual driving mode, the control unit 51 closes the first switch 41 to connect the first wiring 101 and the third wiring 103, and opens the second switch 42 to disconnect the second wiring 102 and the third wiring 103. As illustrated in FIG. 2A, electric power output from the power supply unit 30 and/or electric power stored in the main battery 11 is directly supplied to the secondary system device 22. When the vehicle is in an autonomous driving mode, the control unit 51 opens the first switch 41 to disconnect the first wiring 101 and the third wiring 103, and closes the second switch 42 to connect the second wiring 102 and the third wiring 103. As illustrated in FIG. 2B, electric power output from the power supply unit 30 and/or electric power stored in the main battery 11 is indirectly supplied to the secondary system device 22 via the DC-DC converter 43.

The control unit 51 controls a voltage command value of the DC-DC converter 43 of the connection switching circuit 40 and a heating condition of the heater 53 based on the condition of the subordinate battery 12 that is acquired from the sensor 52. This control is described later.

The sensor 52 is an element provided near the subordinate battery 12 and configured to monitor the condition of the subordinate battery 12. The sensor 52 includes a voltage sensor, a current sensor, and a temperature sensor. The voltage sensor measures a terminal voltage of the subordinate battery 12. The current sensor measures a current flowing into or out of the subordinate battery 12. The temperature sensor measures a temperature of the subordinate battery 12. The condition of the subordinate battery 12 that is monitored by the sensor 52 is output to the control unit 51.

The heater 53 is an element provided near the subordinate battery 12 and configured to heat the subordinate battery 12. Examples of the heater 53 include a heat exchanger using heat generated by an engine. The heater 53 is controlled by the control unit 51.

<Control>

Figure 3:
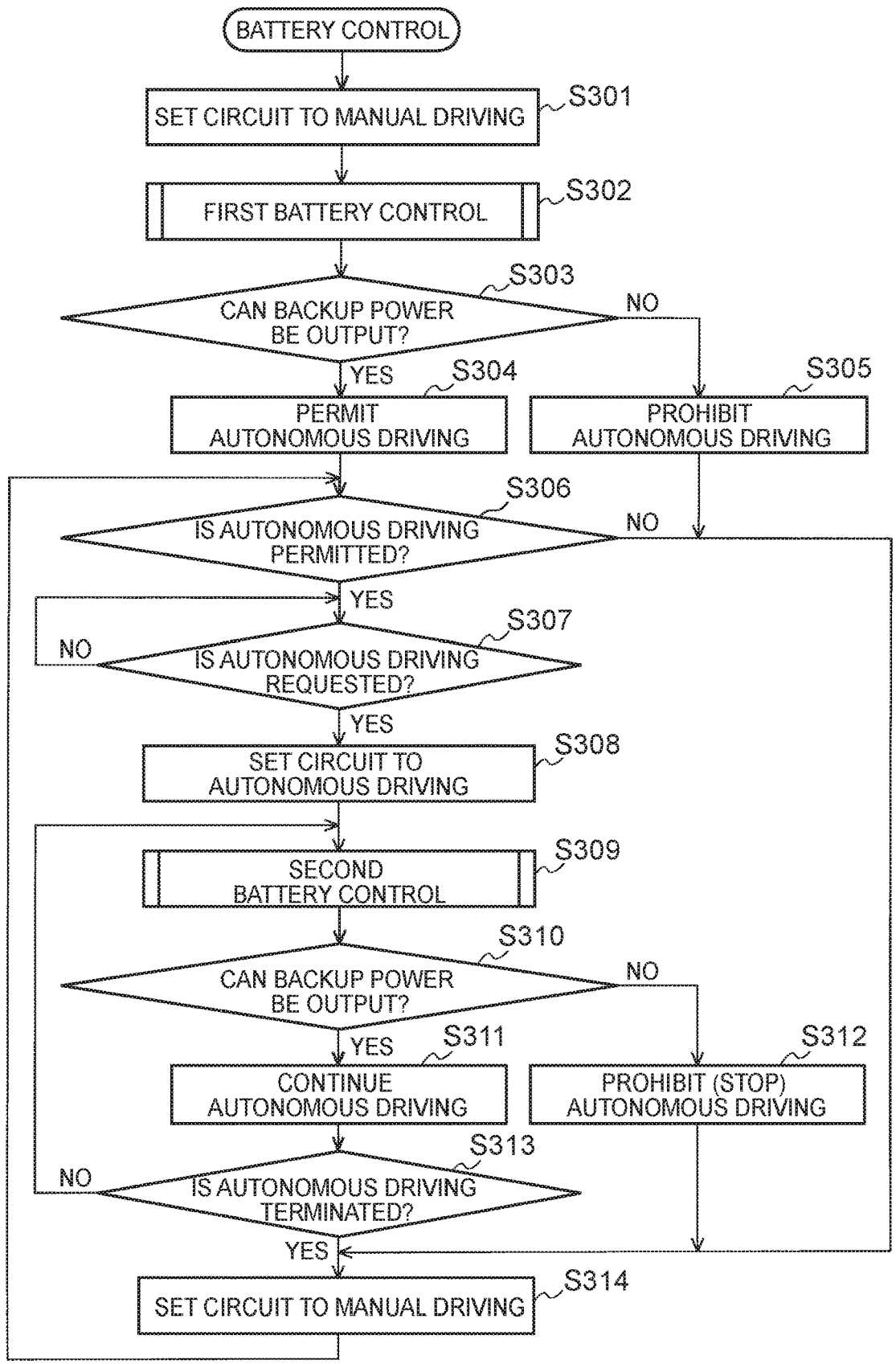
FIG. 3 is a flowchart for describing a processing procedure of battery control to be executed by a control unit.
Figure 4:
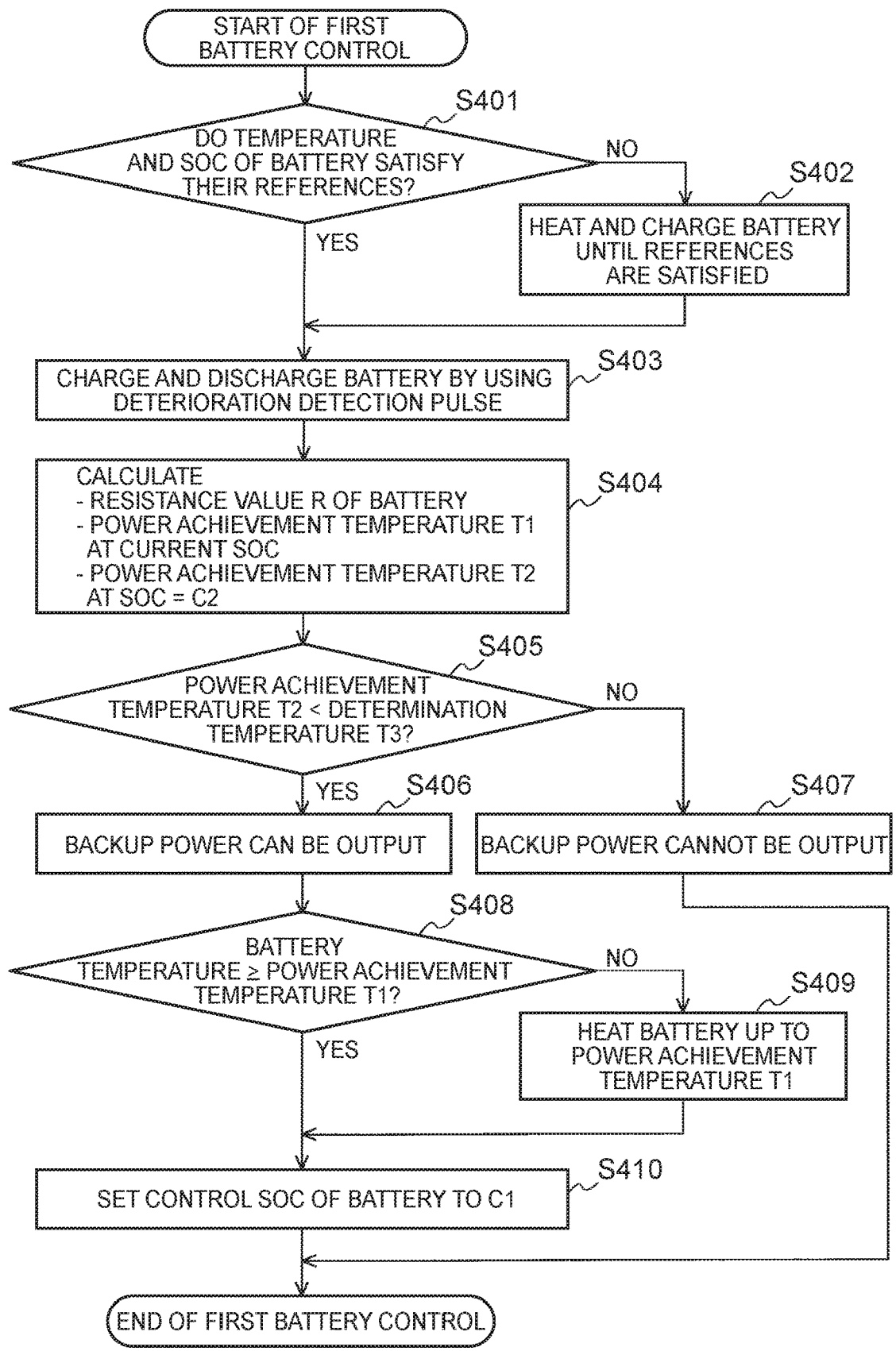
FIG. 4 is a flowchart for describing a detailed processing procedure of first battery control of FIG. 3.
Figure 5A:
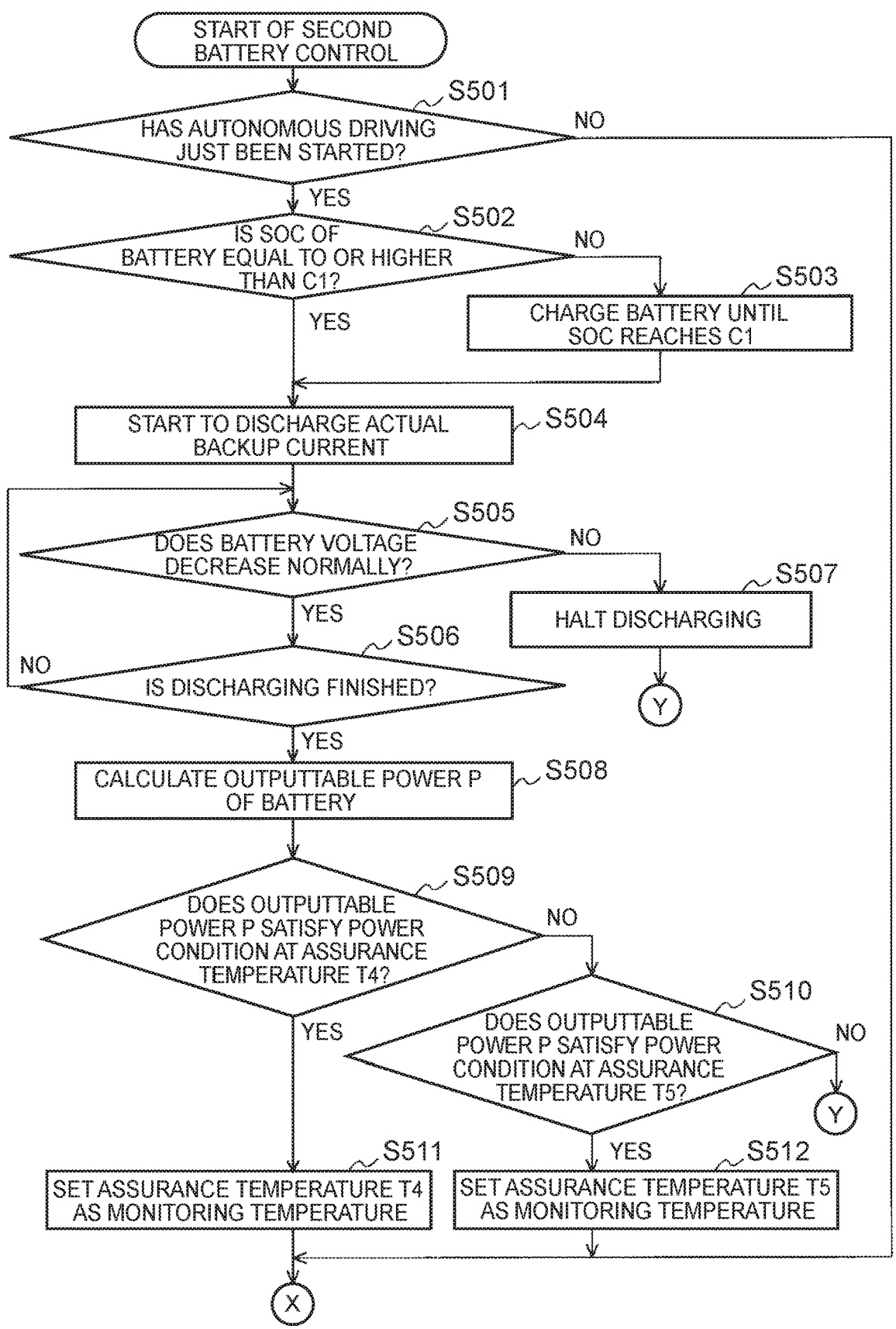
FIG. 5A is a flowchart for describing a detailed processing procedure of second battery control of FIG. 3.
Figure 5B:
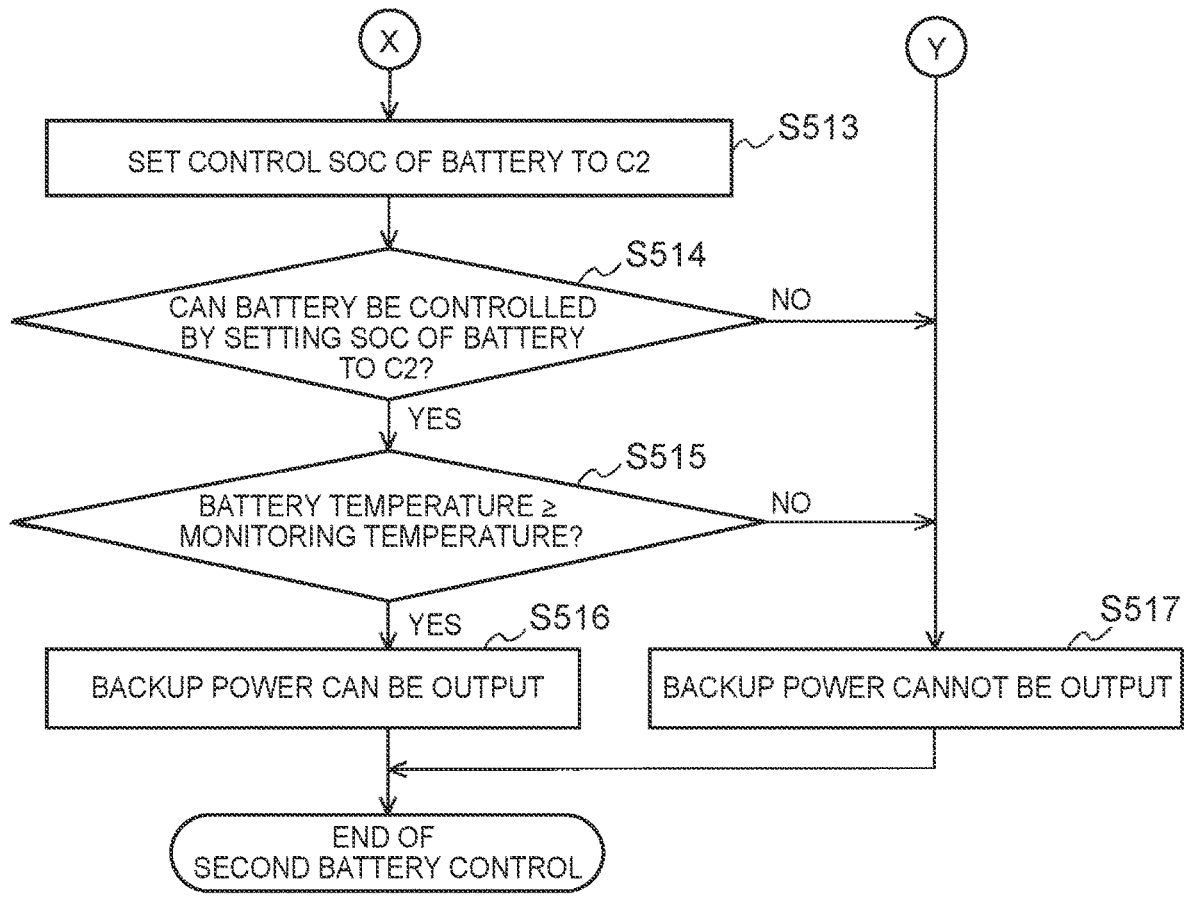
FIG. 5B is a flowchart for describing the detailed processing procedure of the second battery control of FIG. 3.

Next, control to be executed by the vehicle battery controller 1 according to this embodiment is described with reference to FIG. 3 to FIG. 5B as well. FIG. 3 is a flowchart for describing a processing procedure of battery control to be executed by the control unit 51 of the vehicle battery controller 1. FIG. 4 is a flowchart for describing a detailed processing procedure of first battery control (Step S302) of FIG. 3. FIG. 5A and FIG. 5B are flowcharts for describing a detailed processing procedure of second battery control (Step S309) of FIG. 3.

(1) Flow of Battery Control

The battery control illustrated in FIG. 3 is started when the ignition of the vehicle is turned ON (IG-ON), and is repeated until the ignition is turned OFF (IG-OFF). Description is given under the assumption that the vehicle is in the manual driving mode immediately after the ignition is turned ON.

Step S301: The control unit 51 closes the first switch 41 and opens the second switch 42 to set the connection switching circuit 40 to the manual driving (FIG. 2A). When the connection switching circuit 40 is set to the manual driving, the processing proceeds to Step S302.

Step S302: The control unit 51 estimates the condition of the subordinate battery 12 by executing simple first battery control to be finished in a short time (first time) during a period of the manual driving. The first battery control is described later.

Step S303: Based on a result of the estimation of the subordinate battery 12 in the first battery control, the control unit 51 tentatively determines whether the subordinate battery 12 can output predetermined backup power. The backup power is electric power necessary for the limp home mode in which, if the main battery 11 fails into distress and the subordinate battery 12 serves as a power supply in place of the main battery 11, the secondary system device 22 is driven to cause the vehicle to travel at least to a safe place. When the subordinate battery 12 can output the backup power (YES in S303), the processing proceeds to Step S304. When the subordinate battery 12 cannot output the backup power (NO in S303), the processing proceeds to Step S305.

Step S304: The control unit 51 permits the autonomous driving. The permission of the autonomous driving means that the vehicle battery controller 1 is brought into a request waiting state in which switching can immediately be made to the autonomous driving in response to an autonomous driving request generated by, for example, a command from the driver. When the autonomous driving is permitted, the processing proceeds to Step S306.

Step S305: The control unit 51 prohibits the autonomous driving. The prohibition of the autonomous driving means that the vehicle battery controller 1 is brought into a state in which the connection switching circuit 40 is not switched to the autonomous driving even if an autonomous driving request is generated by, for example, a command from the driver. When the autonomous driving is prohibited, the processing proceeds to Step S314.

Step S306: The control unit 51 determines whether the autonomous driving is permitted. When the autonomous driving is permitted (YES in S306), the processing proceeds to Step S307. When the autonomous driving is not permitted (NO in S306), the processing proceeds to Step S314.

Step S307: The control unit 51 determines whether an autonomous driving request is generated by, for example, a command from the driver. When the autonomous driving request is generated (YES in S307), the processing proceeds to Step S308. When the autonomous driving request is not generated, the state of charge (SOC) of the subordinate battery 12 is controlled into a predetermined SOC for the manual driving until the ignition is turned OFF.

Step S308: The control unit 51 opens the first switch 41 and closes the second switch 42 to set the connection switching circuit 40 to the autonomous driving (FIG. 2B). Thus, the autonomous driving is started. When the connection switching circuit 40 is set to the autonomous driving, the processing proceeds to Step S309.

Step S309: The control unit 51 checks the condition of the subordinate battery 12 by executing highly accurate second battery control that requires a longer time (second time) than that of the first battery control during a period of the autonomous driving. The second battery control is described later.

Step S310: Based on a result of the check on the subordinate battery 12 in the second battery control, the control unit 51 determines whether the subordinate battery 12 can output the backup power. When the subordinate battery 12 can output the backup power (YES in S310), the processing proceeds to Step S311. When the subordinate battery 12 cannot output the backup power (NO in S310), the processing proceeds to Step S312.

Step S311: The control unit 51 continues the autonomous driving that is executed currently. Then, the processing proceeds to Step S313.

Step S312: The control unit 51 prohibits the autonomous driving. Specifically, the control unit 51 stops the autonomous driving that is executed currently, and prohibits the autonomous driving after driving authority is transferred to the driver. When the autonomous driving is prohibited, the processing proceeds to Step S314.

Step S313: The control unit 51 determines whether the autonomous driving is terminated by, for example, a command from the driver. When the autonomous driving is terminated (YES in S313), the processing proceeds to Step S314. When the autonomous driving is not terminated (NO in S313), the processing proceeds to Step S309.

Step S314: The control unit 51 closes the first switch 41 and opens the second switch 42 to set the connection switching circuit 40 to the manual driving (FIG. 2A). When the connection switching circuit 40 is set to the manual driving, the processing proceeds to Step S306.

The processing of Steps S301 to S314 is finished when the ignition of the vehicle is turned OFF.

(2) First Battery Control

In the first battery control in Step S302 of FIG. 3, Steps S401 to S410 are executed as illustrated in FIG. 4.

Step S401: The control unit 51 determines whether the temperature and the SOC (power storage amount) of the subordinate battery 12 satisfy their references. If the temperature or the SOC of the subordinate battery 12 is extremely low, the determination accuracy of the first battery control decreases. Therefore, determination is first made whether the temperature of the subordinate battery 12 satisfies a predetermined temperature reference and the SOC of the subordinate battery 12 satisfies a predetermined SOC reference. The references are set as appropriate based on specifications of the subordinate battery 12 or required performance of the vehicle. The SOC of the subordinate battery 12 can be calculated based on information acquired from the sensor 52. When the temperature and the SOC of the subordinate battery 12 satisfy their references (YES in S401), the processing proceeds to Step S403. When the temperature and the SOC of the subordinate battery 12 do not satisfy their references (NO in S401), the processing proceeds to Step S402.

Step S402: The control unit 51 heats and charges the subordinate battery 12 until the temperature and the SOC of the subordinate battery 12 satisfy their references. The subordinate battery 12 is heated by using the heater 53. The subordinate battery 12 is charged by controlling the voltage command value of the DC-DC converter 43. When the temperature and the SOC of the subordinate battery 12 satisfy their references, the processing proceeds to Step S403.

Figure 6A:
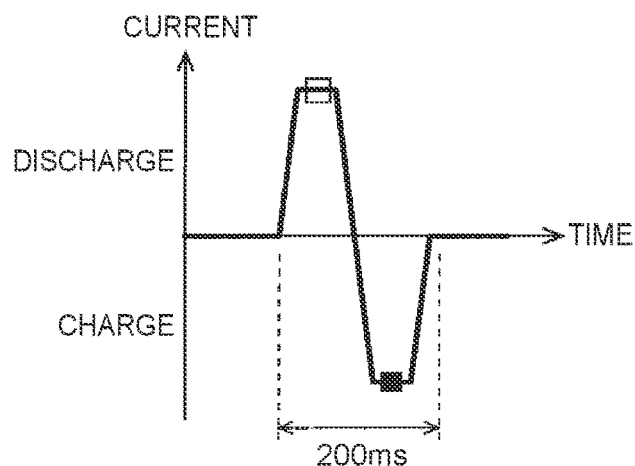
FIG. 6A and FIG. 6B are explanatory drawings of an example of a deterioration detection pulse to be used for the first battery control.

Step S403: The control unit 51 charges and discharges the subordinate battery 12 by using a deterioration detection pulse. For example, the deterioration detection pulse is a single pulse having a period of about 200 milliseconds (first time) as illustrated in FIG. 6A. The control unit 51 observes a voltage and a current of the subordinate battery 12 that change through the charging and discharging with the deterioration detection pulse. For example, as illustrated in FIG. 6A, the control unit 51 can acquire a combination of the voltage and the current of the subordinate battery 12 at a discharging peak and a combination of the voltage and the current of the subordinate battery 12 at a charging peak. When the charging and discharging of the subordinate battery 12 are completed, the processing proceeds to Step S404.

Step S404: The control unit 51 calculates a current resistance value R of the subordinate battery 12, a power achievement temperature T1 at a current SOC of the subordinate battery 12, and a power achievement temperature T2 when the SOC of the subordinate battery 12 is changed to a predetermined value C2 (SOC_C2). The resistance value R, the power achievement temperature T1, and the power achievement temperature T2 are calculated as follows.

Figure 6B:
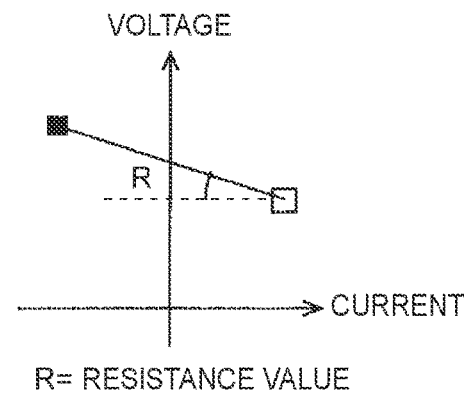

The resistance value R of the subordinate battery 12 is calculated based on the combinations of the voltage and the current of the subordinate battery 12 that are acquired in Step S403. For example, as illustrated in FIG. 6B, the resistance value R can be calculated such that the combination of the voltage and the current at the discharging peak (hollow square □) and the combination of the voltage and the current at the charging peak (solid square ■) are plotted on a voltage-current Cartesian coordinate system and an inclination of a straight line passing through two sets of plotted coordinates is obtained as the resistance value R. If three or more sets of coordinates are plotted, the resistance value R may be calculated from an inclination of an approximate straight line obtained by a least square method or the like.

The power achievement temperature T1 is a temperature when the subordinate battery 12 can output the backup power at a current SOC. The power achievement temperature T2 is a temperature (first temperature) when the subordinate battery 12 can output the backup power at the SOC_C2. The value C2 is an SOC (second power storage amount) serving as a control central value of the charging and discharging of the subordinate battery 12 during the autonomous driving, and is set lower than a value C1 (first power storage amount) that is an SOC serving as a control central value of the charging and discharging of the subordinate battery 12 during the manual driving as described later (C1>C2). The power achievement temperatures T1 and T2 are calculated by using a current resistance value R of the subordinate battery 12, a predetermined standard battery resistance map, and a predetermined resistance value Rref at which the backup power can be output.

As illustrated in FIG. 7, the standard battery resistance map is a two-dimensional correspondence table in which a battery resistance value [Ω] can be determined by using a battery temperature [° C.] and a battery SOC [%] as parameters. For example, the standard battery resistance map may be created based on measured values obtained through experiments using a battery, or based on design values calculated by using specifications of the battery. FIG. 7 demonstrates that the resistance value R is r15 when the battery SOC is 60% and the battery temperature is −15° C. and the resistance value R is r53 when the battery SOC is 40% and the battery temperature is 5° C.

Detailed description is given with reference to FIG. 8A1, FIG. 8A2 and FIG. 8B. It is assumed that the resistance value R is a measured value when the subordinate battery 12 has an SOC of 60% and a temperature of 10° C. (shaded area in FIG. 8A2). In this case, reference is first made to a resistance value r65 under the same conditions in the standard battery resistance map of FIG. 8A1, that is, when the SOC is 60% and the temperature is 10° C. Next, the ratio between the reference resistance value r65 and a resistance value under prediction target conditions is determined in the standard battery resistance map. For example, if an attempt is made to predict a resistance value R43 when the subordinate battery 12 has an SOC of 40% and a temperature of 0° C. (thick-box area in FIG. 8A2), the ratio between the reference resistance value r65 and a resistance value r43 under the same conditions in the standard battery resistance map of FIG. 8A1, that is, when the SOC is 40% and the temperature is 0° C. is determined (=r43/r65). The resistance value R43 of the subordinate battery 12 can be predicted by multiplying the measured resistance value R of the subordinate battery 12 by the determined ratio (R43=R×r43/r65).

Figures 8B, 9:
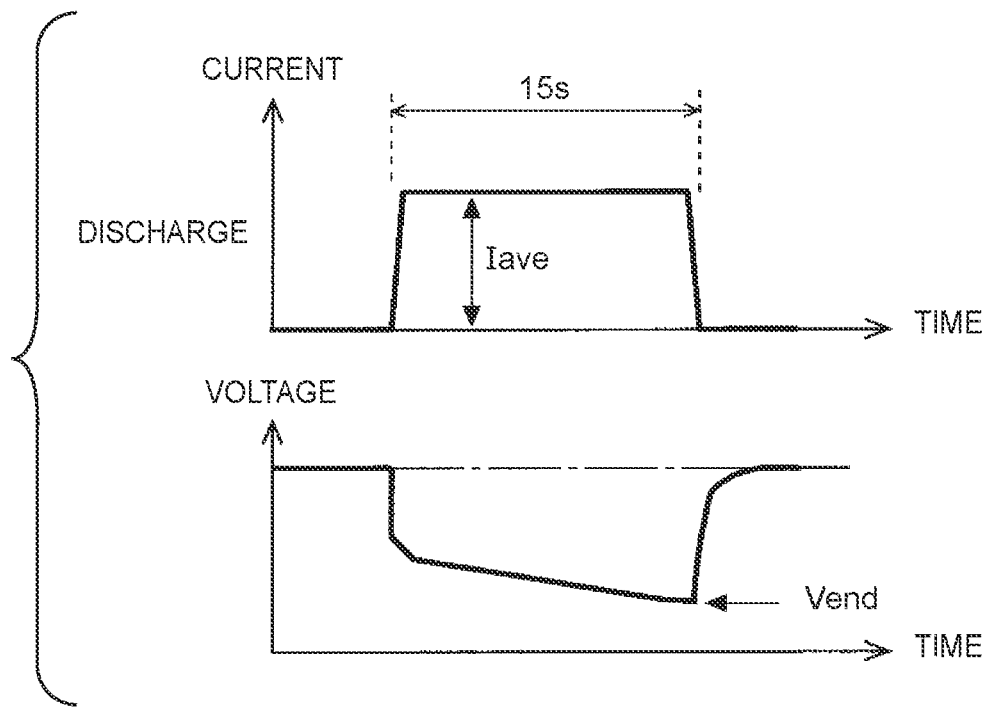
FIG. 8B is an explanatory drawing illustrating an example of use of the standard battery resistance map.
FIG. 9 is a diagram illustrating an example of an actual backup current to be used for the second battery control.

Resistance values R15 to R75 at all temperatures (−15 to +15° C.) and the SOC of 60% as the current SOC of the subordinate battery 12 and resistance values R13 to R73 at all the temperatures (−15 to +15° C.) and the SOC of 40% as the SOC_C2 of the subordinate battery 12 are predicted by using similar procedures (FIG. 8B).

When the prediction of the resistance values R15 to R75 of the subordinate battery 12 at the current SOC (60%) and the resistance values R13 to R73 of the subordinate battery 12 at the SOC_C2 (40%) is finished, the power achievement temperatures T1 and T2 are finally calculated. The power achievement temperatures T1 and T2 are calculated based on the resistance value Rref at which the backup power can be output. The resistance value Rref is determined in advance for the subordinate battery 12. For example, if R15 to R35 satisfy the resistance value Rref when the SOC of the subordinate battery 12 is 60%, −5° C. is calculated as the power achievement temperature T1. If R13 and R23 satisfy the resistance value Rref when the SOC of the subordinate battery 12 is 40%, −10° C. is calculated as the power achievement temperature T2.

Step S405: The control unit 51 determines whether the power achievement temperature T2 calculated in Step S404 is lower than a predetermined determination temperature T3. The determination temperature T3 is a preset temperature (first reference temperature) for determining whether the battery deteriorates to the extent that the battery is inappropriate for backup. The determination temperature T3 is typically a temperature for determining whether to replace the battery. This determination is made to determine that the battery is inappropriate for backup when a resistance value at which the subordinate battery 12 can output the backup power is satisfied by changing the temperature but the temperature needs to be increased excessively. When the power achievement temperature T2 is lower than the determination temperature T3 (YES in S405), the processing proceeds to Step S406. When the power achievement temperature T2 is equal to or higher than the determination temperature T3 (NO in S405), the processing proceeds to Step S407.

Step S406: The control unit 51 tentatively determines that the subordinate battery 12 can output the backup power. When determination is made that the backup power can be output, the processing proceeds to Step S408.

Step S407: The control unit 51 tentatively determines that the subordinate battery 12 cannot output the backup power. When determination is made that the backup power cannot be output, the first battery control is finished.

Step S408: The control unit 51 determines whether the temperature of the subordinate battery 12 is equal to or higher than the power achievement temperature T1 calculated in Step S404. This determination is made to determine whether a current temperature of the subordinate battery 12 is equal to or higher than the power achievement temperature T1 at which the backup power can be output. When the temperature of the subordinate battery 12 is equal to or higher than the power achievement temperature T1 (YES in S408), the processing proceeds to Step S410. When the temperature of the subordinate battery 12 is lower than the power achievement temperature T1 (NO in S408), the processing proceeds to Step S409.

Step S409: The control unit 51 heats the subordinate battery 12 until the temperature of the subordinate battery 12 reaches the power achievement temperature T1. The subordinate battery 12 is heated by using the heater 53. When the temperature of the subordinate battery 12 reaches the power achievement temperature T1, the processing proceeds to Step S410.

Step S410: The control unit 51 sets the value C1 as the SOC serving as the control central value of the charging and discharging of the subordinate battery 12 (control SOC). The value C1 is a control SOC of the subordinate battery 12 to be set during the manual driving. The value C1 is desirably set as high as possible without causing overcharge based on an upper limit power storage value so that the manual driving can quickly be switched to the autonomous driving. When the control SOC of the subordinate battery 12 is set to the value C1, the first battery control is finished.

By executing the first battery control in accordance with the processing of Steps S401 to S410, determination on the condition of the subordinate battery 12 can tentatively be made in a short time.

(3) Second Battery Control

In the second battery control in Step S309 of FIG. 3, processing of Steps S501 to S516 is executed as illustrated in FIG. 5A and FIG. 5B. The processing of FIG. 5A and the processing of FIG. 5B are connected by connectors X and Y.

Step S501: The control unit 51 determines whether the manual driving is switched to the autonomous driving and the autonomous driving has just been started. Specifically, when the processing proceeds from Step S308 in the flowchart of FIG. 3, determination is made that the autonomous driving has just been started. When the processing proceeds from Step S313, determination is made that the autonomous driving has not just been started. When the autonomous driving has just been started (YES in S501), the processing proceeds to Step S502. When the autonomous driving has not just been started (NO in S501), the processing proceeds to Step S513.

Step S502: The control unit 51 determines whether the SOC of the subordinate battery 12 is equal to or higher than the value C1. This determination is made for the following reason. If the SOC of the subordinate battery 12 is at least the value C1, the SOC of the subordinate battery 12 does not decrease to a level at which the operation of the secondary system device 22 is stopped in processing of discharging an actual current necessary for backup as described later. When the SOC of the subordinate battery 12 is equal to or higher than the value C1 (YES in S502), the processing proceeds to Step S504. When the SOC of the subordinate battery 12 is lower than the value C1 (NO in S502), the processing proceeds to Step S503.

Step S503: The control unit 51 charges the subordinate battery 12 until the SOC of the subordinate battery 12 reaches the value C1. The subordinate battery 12 is charged by controlling the voltage command value of the DC-DC converter 43. When the SOC of the subordinate battery 12 reaches the value C1, the processing proceeds to Step S504.

Step S504: The control unit 51 starts to discharge an actual current necessary for backup (actual backup current) from the subordinate battery 12. The actual backup current is necessary for the subordinate battery 12 to operate the secondary system device 22 in distress in place of the main battery 11 until the vehicle travels to at least a safe place in the limp home mode. For example, as illustrated in FIG. 9, it is necessary to continuously supply a predetermined current over a long time (second time such as 15 seconds). Since the actual backup current is supplied over a long time, determination on the condition of the subordinate battery 12 can be made with higher accuracy than that of the first battery control. When the discharging of the actual backup current from the subordinate battery 12 is started, the processing proceeds to Step S505.

Step S505: The control unit 51 determines whether the voltage of the subordinate battery 12 decreases normally. This determination is made to determine whether an abnormality (such as a cell abnormality) occurs in the subordinate battery 12. In Step S504, an actual backup current having a constant value flows as illustrated in FIG. 9. Therefore, the voltage of the subordinate battery 12 may decrease at a magnitude of a change rate d lower than a predetermined value (positive value) except for the time when the discharging is started. If an abnormality occurs in the subordinate battery 12 as illustrated in FIG. 10A, the voltage of the subordinate battery 12 abruptly decreases at a magnitude of a change rate d equal to or higher than the predetermined value. Therefore, determination is made on this phenomenon to prevent the voltage of the subordinate battery 12 from decreasing below a minimum assurance voltage (for example, 10.5 V) that assures the operation of the secondary system device 22. If a fluctuation in the discharge current is detected based on a rush current (FIG. 10B) for distinction from a normal voltage decrease caused by an operation of an electric brake or an electric power steering system when the vehicle is traveling normally, determination is made "normal" even if the voltage of the subordinate battery 12 decreases at a magnitude of a change rate equal to or higher than the predetermined value. When the voltage of the subordinate battery 12 decreases normally (YES in S505), the processing proceeds to Step S506. When the voltage of the subordinate battery 12 does not decrease normally (NO in S505), the processing proceeds to Step S507.

Step S506: The control unit 51 determines whether the discharging of the actual backup current from the subordinate battery 12 is finished as expected because the voltage of the subordinate battery 12 decrease normally. When the discharging of the subordinate battery 12 is finished (YES in S506), the processing proceeds to Step S508. When the discharging of the subordinate battery 12 is not finished (NO in S506), the processing proceeds to Step S505.

Step S507: The control unit 51 halts the discharging of the subordinate battery 12 because the voltage of the subordinate battery 12 decrease abnormally. By immediately halting the discharging when the abnormality is detected, the voltage of the subordinate battery 12 is prevented from decreasing below the minimum assurance voltage. Thus, the stop of the operation of the secondary system device 22 can be prevented. After the discharging of the subordinate battery 12 is halted, the processing proceeds to Step S517.

Step S508: The control unit 51 calculates actual electric power that can be supplied from the subordinate battery 12 to the secondary system device 22 (outputtable power P) while maintaining the minimum assurance voltage. The outputtable power P can be calculated from Expression [1] based on a voltage value of the subordinate battery 12 when the discharging of the actual backup current is finished (post-discharging decreased voltage $V_{end}$) and an average value of the current flowing from the subordinate battery 12 during the discharging period (average current $I_{ave}$) (see FIG. 9). When the outputtable power P is calculated, the processing proceeds to Step S509.

Outputtable power $P$=Post-discharging decreased voltage $V_{end}$×Average current $I_{ave}$   [1]

Step S509: The control unit 51 determines whether the outputtable power P of the subordinate battery 12 that is calculated in Step S508 satisfies a power condition at a predetermined assurance temperature T4. The assurance temperature T4 is a minimum temperature of the subordinate battery 12 (second reference temperature) that assures backup when a long time has not passed from the start of use and the battery does not significantly deteriorate over time. This determination is made based on a predetermined determination map. The determination map is a two-dimensional correspondence table in which the outputtable power P that enables backup is determined by using the temperature [° C.] and the SOC [%] of the subordinate battery 12 as parameters.

FIG. 11A illustrates an example of the determination map when the assurance temperature T4 is −15° C. The T4 determination map of FIG. 11A shows values (P11 to P53) of the outputtable power P to be satisfied by the subordinate battery 12 under respective conditions in order that the subordinate battery 12 can execute backup when the temperature is −15° C. and the SOC is 40%. For example, if the outputtable power P of the subordinate battery 12 that is calculated when the temperature is 0° C. and the SOC is 45% is equal to or higher than outputtable power P42 shown in the T4 determination map, determination is made that backup is assured for the subordinate battery 12 even if the temperature changes to −15° C. and the SOC changes to 40%.

In Step S509, determination is made whether the power condition is satisfied at the assurance temperature T4 by determining whether the outputtable power P of the subordinate battery 12 that is calculated in Step S508 is equal to or higher than the outputtable power P in the T4 determination map associated with the temperature and the SOC of the subordinate battery 12 at the time of calculation. When the outputtable power P satisfies the power condition at the assurance temperature T4 (YES in S509), the processing proceeds to Step S511. When the outputtable power P does not satisfy the power condition at the assurance temperature T4 (NO in S509), the processing proceeds to Step S510.

Step S510: Since the outputtable power P does not satisfy the power condition at the assurance temperature T4 in Step S509, the control unit 51 determines that the power of the subordinate battery 12 decreases due to deterioration over time. Next, the control unit 51 determines whether the outputtable power P of the subordinate battery 12 satisfies a power condition at a predetermined assurance temperature T5. The assurance temperature T5 is a minimum temperature of the subordinate battery 12 (second reference temperature) that assures backup when the subordinate battery 12 that deteriorates over time is continuously used while controlling the temperature with the heater 53. The assurance temperature T5 is set higher than the assurance temperature T4. This determination is also made based on a determination map in which the outputtable power P that enables backup is determined by using the temperature [° C.] and the SOC [%] of the subordinate battery 12 as parameters.

Figure 11B:
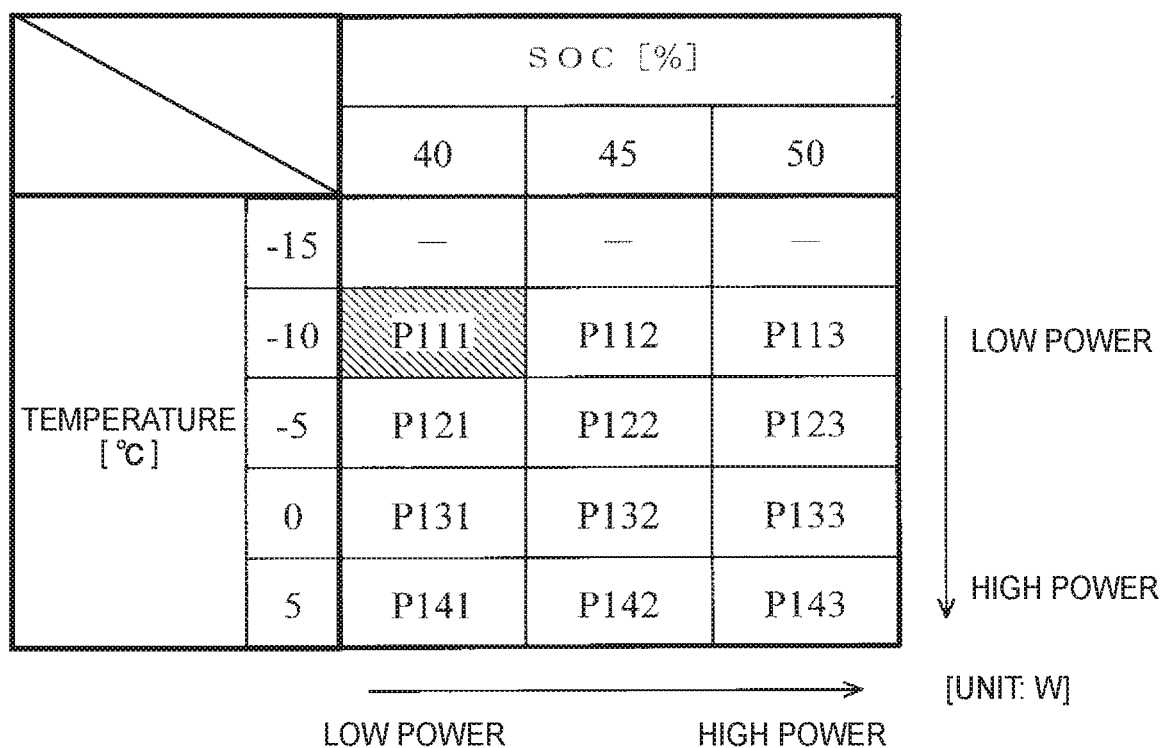
FIG. 11B is a diagram illustrating an example of a T5 determination map.

FIG. 11B illustrates an example of the determination map when the assurance temperature T5 is −10° C. The T5 determination map of FIG. 11B shows values (P111 to P143) of the outputtable power P to be satisfied by the subordinate battery 12 under respective conditions in order that the subordinate battery 12 can execute backup when the temperature is −10° C. and the SOC is 40%. For example, if the outputtable power P of the subordinate battery 12 that is calculated when the temperature is 0° C. and the SOC is 45% is equal to or higher than outputtable power P132 shown in the T5 determination map, determination is made that backup is assured for the subordinate battery 12 even if the temperature changes to −10° C. and the SOC changes to 40%.

In Step S510, determination is made whether the power condition is satisfied at the assurance temperature T5 by determining whether the outputtable power P of the subordinate battery 12 that is calculated in Step S508 is equal to or higher than the outputtable power P in the T5 determination map associated with the temperature and the SOC of the subordinate battery 12 at the time of calculation. When the outputtable power P satisfies the power condition at the assurance temperature T5 (YES in S510), the processing proceeds to Step S512. When the outputtable power P does not satisfy the power condition at the assurance temperature T5 (NO in S510), the processing proceeds to Step S517.

In Steps S509 and S510, description is given of the case where determination is made whether the outputtable power P of the subordinate battery 12 satisfies the predetermined power condition by using the two assurance temperatures T4 and T5. This determination may be made by using the assurance temperature T4 alone, or by using three or more stepwise assurance temperatures depending on the degree of the decrease in the power of the subordinate battery 12 due to deterioration over time (deterioration degree).

Step S511: The control unit 51 sets the assurance temperature T4 as a monitoring temperature. The monitoring temperature serves as a reference for determining whether to continue the autonomous driving in progress. When the monitoring temperature is set, the processing proceeds to Step S513.

Step S512: The control unit 51 sets the assurance temperature T5 as the monitoring temperature. When the monitoring temperature is set, the processing proceeds to Step S513.

Step S513: The control unit 51 sets the value C2 as the SOC serving as the control central value of the charging and discharging of the subordinate battery 12 (control SOC). The value C2 is a control SOC of the subordinate battery 12 to be set during the autonomous driving. The value C2 is desirably set appropriately depending on the secondary system device 22 whose withstand voltage is lower than that of the primary system device 21. When the control SOC of the subordinate battery 12 is set to the value C2, the processing proceeds to Step S514.

Step S514: The control unit 51 determines whether the subordinate battery 12 can be controlled by setting the SOC of the subordinate battery 12 to the value C2. This determination is made to detect a situation in which the subordinate battery 12 cannot be controlled by the value C2 in an actual operation (abnormality or deterioration) though the control SOC is set to the value C2 in Step S513. When the subordinate battery 12 can be controlled by setting the SOC of the subordinate battery 12 to the value C2 (YES in S514), the processing proceeds to Step S515. When the subordinate battery 12 cannot be controlled by setting the SOC of the subordinate battery 12 to the value C2 (NO in S514), the processing proceeds to Step S517.

Step S515: The control unit 51 determines whether the temperature of the subordinate battery 12 is equal to or higher than the monitoring temperature. This determination is made to detect whether the temperature of the subordinate battery 12 decreases below the assurance temperature (T4 or T5). When the temperature of the subordinate battery 12 is equal to or higher than the monitoring temperature (YES in S515), the processing proceeds to Step S516. When the temperature of the subordinate battery 12 is lower than the monitoring temperature (NO in S515), the processing proceeds to Step S517.

Step S516: The control unit 51 determines that the subordinate battery 12 can output the backup power. When determination is made that the subordinate battery 12 can output the backup power, the second battery control is finished.

Step S517: The control unit 51 determines that the subordinate battery 12 cannot output the backup power. When determination is made that the subordinate battery 12 cannot output the backup power, the second battery control is finished.

By executing the second battery control in accordance with the processing of Steps S501 to S517, determination on the condition of the subordinate battery 12 can accurately be made by using the actual backup current.

(4) Timing Charts

Figure 12:
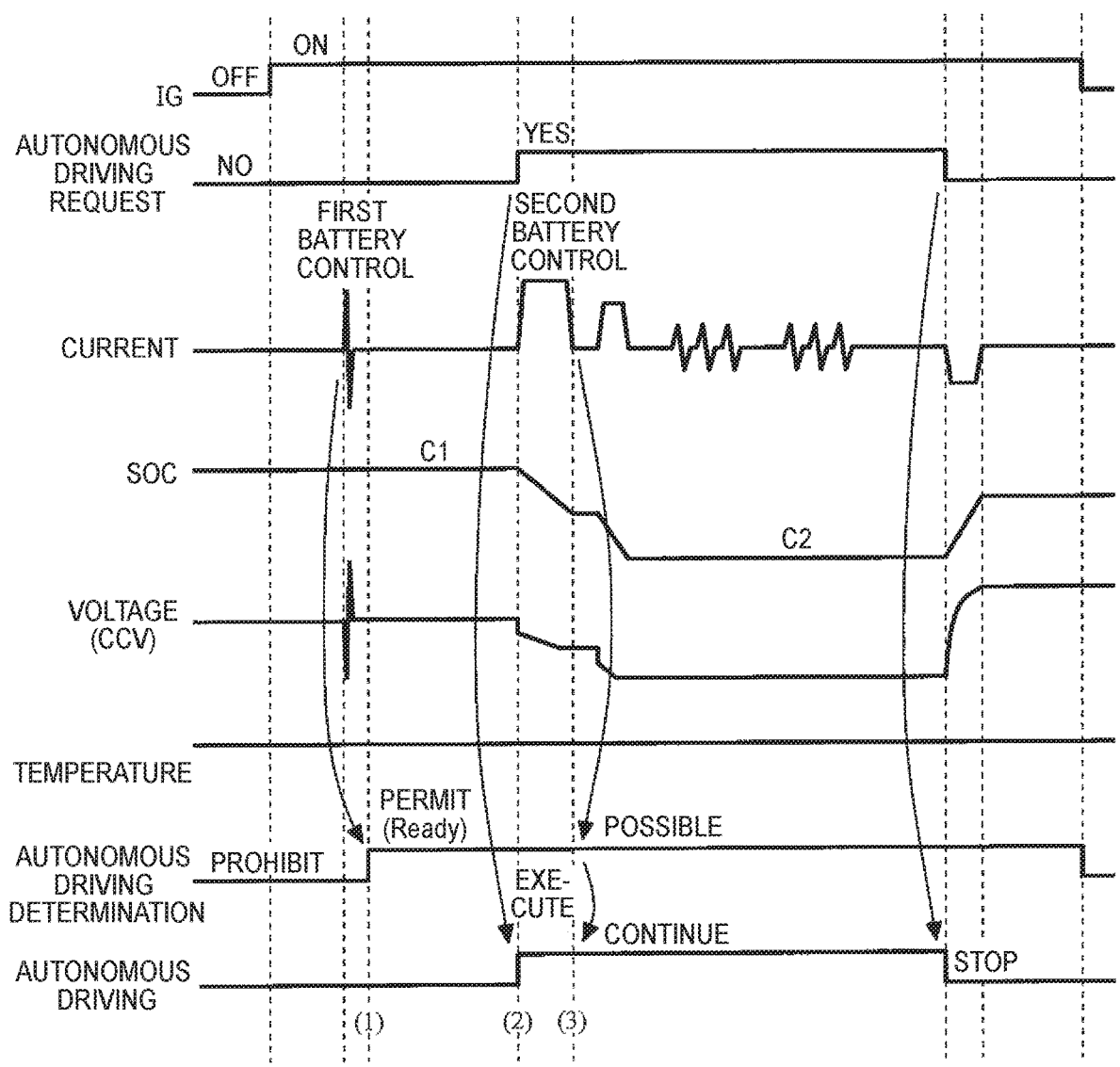
FIG. 12 is a diagram illustrating an execution timing of the autonomous driving in the vehicle battery controller of the present disclosure.
Figure 13:
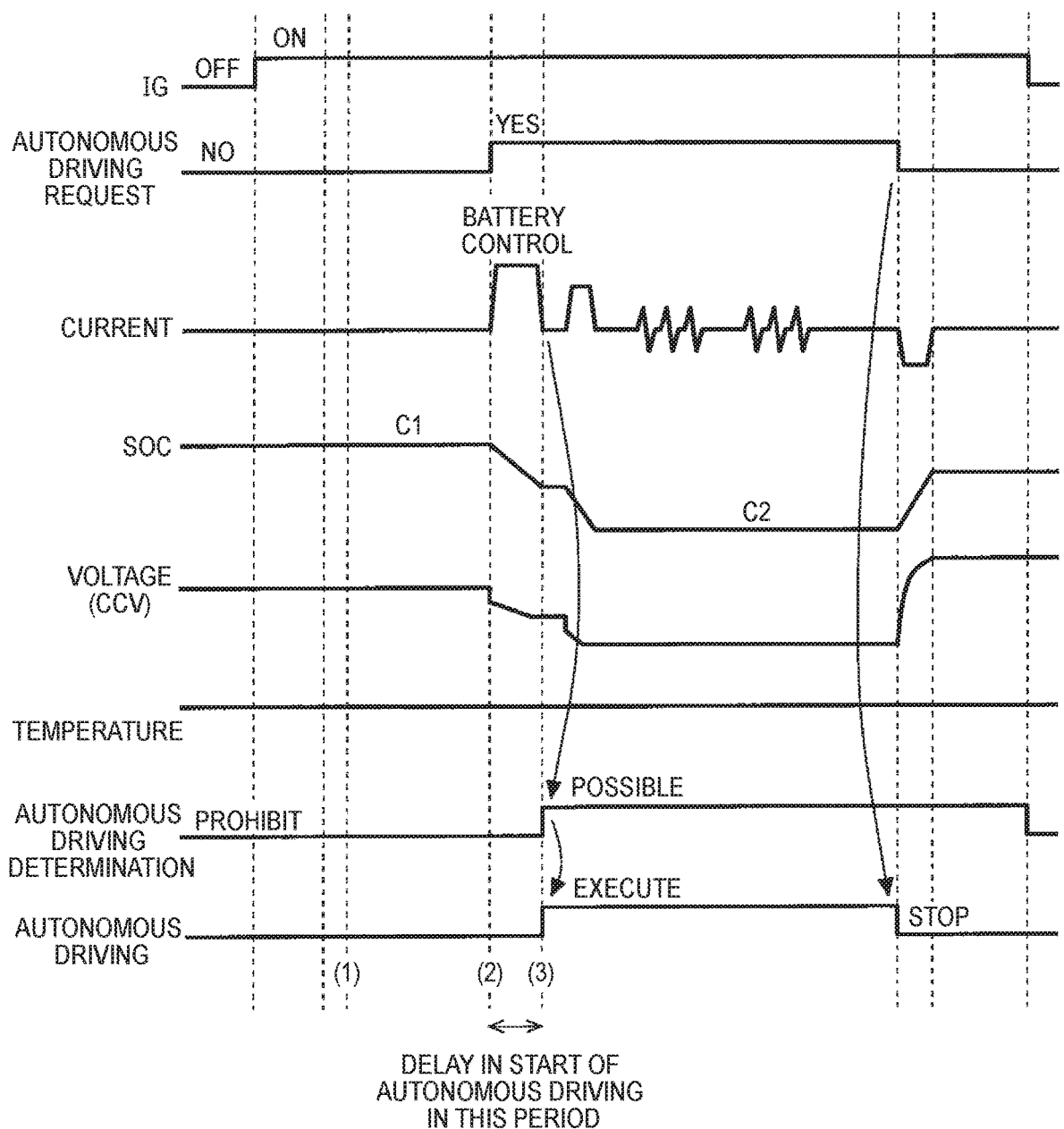
FIG. 13 is a diagram illustrating an execution timing of autonomous driving in a related-art vehicle battery controller.

Referring to FIG. 12 and FIG. 13, description is given of the feature that the autonomous driving requested by the driver can quickly be executed in the vehicle battery controller 1 according to this embodiment. FIG. 12 is a diagram illustrating an execution timing of the autonomous driving in the vehicle battery controller 1 according to this embodiment. FIG. 13 is a diagram illustrating an execution timing of autonomous driving in a related-art vehicle battery controller.

In the vehicle battery controller 1 illustrated in FIG. 12, the autonomous driving is permitted by executing the first battery control in the stage of manual driving (timing (1)). Thus, the autonomous driving can immediately be started when an autonomous driving request is actually generated (timing (2)). The second battery control is executed in conjunction with the execution of the autonomous driving. If determination is then accurately made that the subordinate battery 12 can back up the autonomous driving (timing (3)), the autonomous driving is continued.

In the related-art vehicle battery controller illustrated in FIG. 13, battery control is executed when an autonomous driving request is actually generated. Even though the autonomous driving request is actually generated (timing (2)), the autonomous driving cannot be started until determination is made (timing (3)). Thus, the start of the autonomous driving is delayed for a period from the timing (2) to the timing (3).

Figure 14:
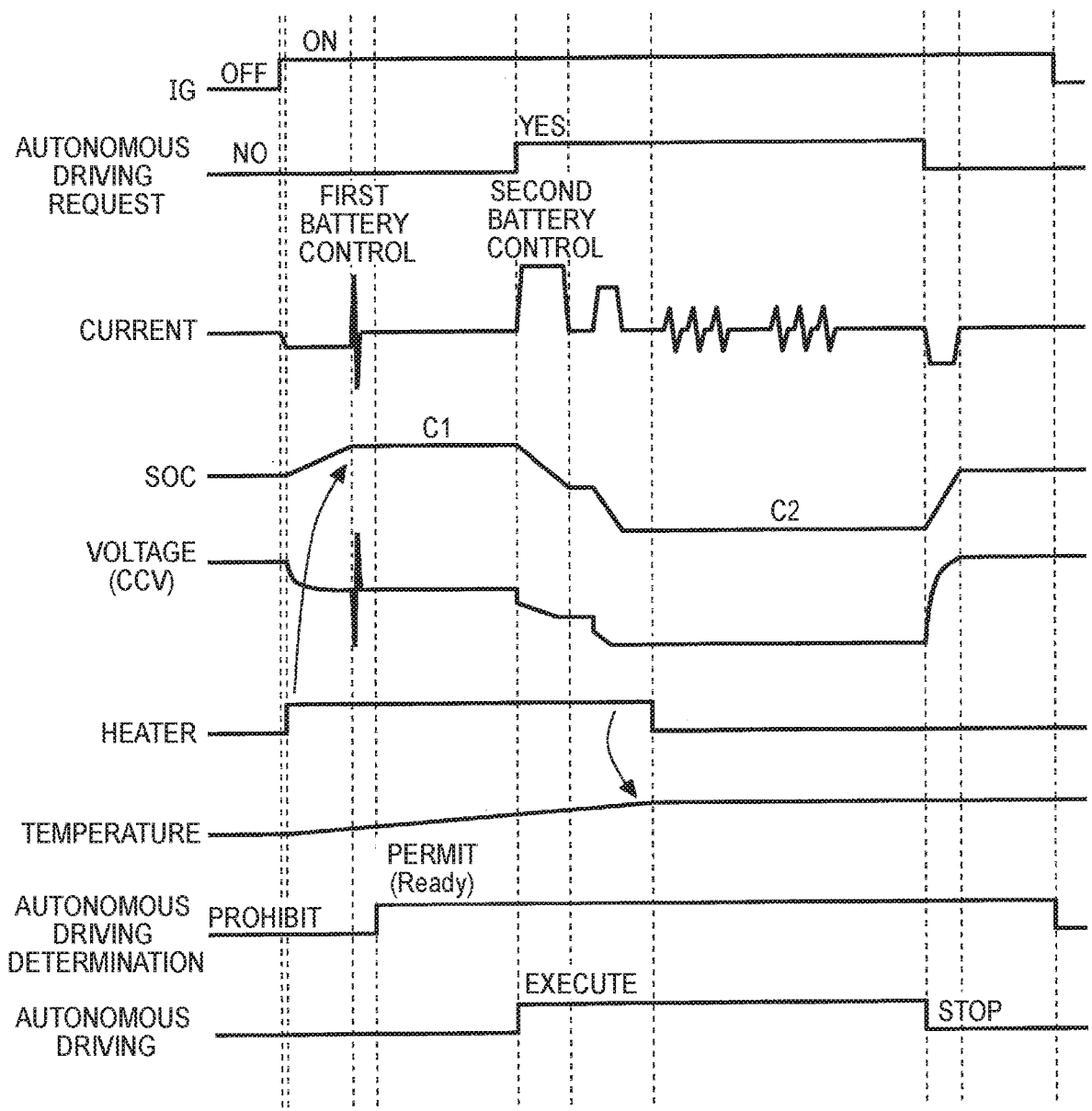
FIG. 14 is a diagram illustrating another execution timing of the autonomous driving in the vehicle battery controller of the present disclosure.

In a situation in which the SOC decreases due to a low temperature of the subordinate battery 12 in a cold region or the like, the temperature may be increased by heating the subordinate battery 12 with the heater 53 simultaneously with a timing when the ignition is turned ON as illustrated in FIG. 14. Thus, output power can be secured in a short time after the ignition is turned ON, and the autonomous driving can be permitted quickly.

[Actions and Effects]

The vehicle battery controller 1 according to the embodiment of the present disclosure estimates the condition of the subordinate battery 12 in a short time during a period of the manual driving after the ignition is turned ON (first battery control), and tentatively determines, based on the estimation result, whether the subordinate battery 12 can output the backup power necessary during the limp home mode of the autonomous driving (first battery control). When determination is tentatively made that the subordinate battery 12 can output the backup power, the vehicle battery controller 1 is brought into a state in which the autonomous driving is permissible immediately. Thus, when determination is tentatively made that the subordinate battery 12 can output the backup power before the driver or the like requests the autonomous driving, the requested autonomous driving can quickly be executed after the autonomous driving is permitted.

In the vehicle battery controller 1 according to this embodiment, when the autonomous driving is actually executed in response to a request from the driver or the like after the autonomous driving is permitted, the backup current necessary during the limp home mode of the autonomous driving is actually supplied to accurately determine whether the subordinate battery 12 can output the backup power (second battery control). Thus, determination can securely be made whether the subordinate battery 12 can output the backup power.

In the vehicle battery controller 1 according to this embodiment, the discharging of the subordinate battery 12 in the second battery control is stopped when determination is made that the output voltage of the subordinate battery 12 decreases at a magnitude of a change rate equal to or higher than the predetermined value during the discharging of the subordinate battery 12. Therefore, the voltage of the subordinate battery 12 is prevented from decreasing below the minimum assurance voltage that assures the operation of the secondary system device 22. Thus, the stop of the operation of the secondary system device 22 can be prevented.

In the vehicle battery controller 1 according to this embodiment, the control SOC serving as the control central value of the charging and discharging of the subordinate battery 12 during the autonomous driving (SOC_C2) is set based on the withstand voltage of the secondary system device 22. Through this control, the secondary system device 22 can be protected and backup can be assured during the autonomous driving.

Although the embodiment of the present disclosure is described above, the present disclosure may be regarded as a vehicle battery controller, a power supply system including the vehicle battery controller, a battery control method to be executed by the vehicle battery controller, a battery control program, a non-transitory computer-readable recording medium that stores the battery control program, or a vehicle on which the vehicle battery controller is mounted.

The vehicle battery controller of the present disclosure is applicable to, for example, a vehicle including a backup battery for autonomous driving.

What is claimed is:

1. A vehicle battery controller comprising:
   a sensor configured to acquire information related to a current, a voltage, and a temperature of a subordinate battery configured to back up a main battery during autonomous driving;
   a DC-DC converter provided between the main battery and the subordinate battery;
   a switching circuit configured to switch a connection state of the subordinate battery between a connection state for manual driving and a connection state for the autonomous driving; and
   an electronic control unit configured to:
      control charging and discharging of the subordinate battery by controlling the DC-DC converter and the switching circuit based on the information acquired by the sensor;
      tentatively determine, by executing a first battery control during a period of the manual driving after an ignition is turned ON, whether the subordinate battery is able to output backup power necessary during a limp home mode of the autonomous driving;
      permit the autonomous driving when determination is made, through the first battery control, that the subordinate battery is able to output the backup power;
      execute the autonomous driving in response to a request after the autonomous driving is permitted; and
      determine, by executing a second battery control after the autonomous driving is permitted, whether the subordinate battery is able to output the backup power, the second battery control having a higher accuracy than an accuracy of the first battery control.

2. The vehicle battery controller according to claim 1, wherein the electronic control unit is configured to:
   control, during the manual driving, a power storage amount of the subordinate battery to be a first power storage amount set based on an upper limit power storage value; and
   control, during the autonomous driving, the power storage amount of the subordinate battery to be a second power storage amount that is lower than the first power storage amount and is set based on a withstand voltage of a device that is on-board a vehicle to which the vehicle battery controller is provided and that is electrically connected to the subordinate battery during the autonomous driving.

3. The vehicle battery controller according to claim 1, wherein the electronic control unit is configured to prohibit the autonomous driving when the electronic control unit determines, by executing the second battery control after the autonomous driving is permitted, that the subordinate battery is not able to output the backup power.

4. The vehicle battery controller according to claim 1, wherein the electronic control unit is configured to, as the first battery control:
   execute charging and discharging of the subordinate battery in a first time;
   calculate a resistance value of the subordinate battery based on changes in the current and the voltage during the charging and discharging;
   estimate whether a first temperature of the subordinate battery is lower than a first reference temperature, the first temperature being obtained based on the calculated resistance value under a condition that a resistance value and a power storage amount necessary for backup are satisfied; and
   determine that the subordinate battery is able to output the backup power when estimation is made that the first temperature of the subordinate battery is lower than the first reference temperature.

5. The vehicle battery controller according to claim 4, wherein the electronic control unit is configured to, as the second battery control:
   execute discharging of the subordinate battery in a second time longer than the first time;
   calculate an average current during the discharging and a decreased voltage after the discharging;
   determine whether outputtable power of the subordinate battery is equal to or greater than the backup power required for the subordinate battery at a second reference temperature, the outputtable power being obtained based on the average current and the decreased voltage that are calculated; and
   determine that the subordinate battery is able to output the backup power when determination is made that the outputtable power of the subordinate battery is equal to or greater than the backup power required for the subordinate battery at the second reference temperature.

6. The vehicle battery controller according to claim 5, wherein the electronic control unit is configured to cause a current to flow during the discharging of the subordinate battery, the current being necessary during the limp home mode of the autonomous driving.

7. The vehicle battery controller according to claim 5, wherein the electronic control unit is configured to stop the discharging of the subordinate battery in the second battery control when determination is made that an output voltage of the subordinate battery decreases at a magnitude of a change rate equal to or higher than a predetermined value during the discharging of the subordinate battery.

8. The vehicle battery controller according to claim 5, wherein the electronic control unit is configured to provide a plurality of the second reference temperatures depending on a deterioration degree of the subordinate battery.

\* \* \* \* \*